(12) United States Patent
Mott

(10) Patent No.: US 8,039,787 B2
(45) Date of Patent: Oct. 18, 2011

(54) DIGITAL PULSE PROCESSOR SLOPE CORRECTION

(75) Inventor: Richard B. Mott, Ringoes, NJ (US)

(73) Assignee: PulseTor, LLC, Ringoes, NJ (US)

( * ) Notice: Subject to any disclaimer, the term of this patent is extended or adjusted under 35 U.S.C. 154(b) by 685 days.

(21) Appl. No.: 12/184,500

(22) Filed: Aug. 1, 2008

(65) Prior Publication Data

US 2009/0033913 A1    Feb. 5, 2009

Related U.S. Application Data

(60) Provisional application No. 60/963,312, filed on Aug. 3, 2007.

(51) Int. Cl.
*G01D 18/00* (2006.01)

(52) U.S. Cl. .................................................. 250/252.1

(58) Field of Classification Search ............... 250/252.1, 250/370.01–370.15, 336.1–336.2, 389, 374, 250/395, 369, 363.01–363.1; 378/98.8, 91, 378/53, 45, 83, 88; 235/151.31, 183
See application file for complete search history.

(56) References Cited

U.S. PATENT DOCUMENTS

| | | | |
|---|---|---|---|
| 3,872,287 A | | 3/1975 | Koeman |
| 3,928,766 A | * | 12/1975 | Clausen et al. ................. 378/45 |
| 4,152,596 A | | 5/1979 | Marshall, III |
| 4,217,496 A | | 8/1980 | Daniels et al. |
| 4,593,198 A | | 6/1986 | Pang et al. |
| 4,612,443 A | | 9/1986 | Alcidi |
| 4,692,626 A | | 9/1987 | Westphal |
| 4,835,703 A | | 5/1989 | Arnold et al. |
| 4,870,282 A | | 9/1989 | Lacy |
| 4,968,889 A | | 11/1990 | Hartwell et al. |
| 5,120,962 A | | 6/1992 | Rundt et al. |
| 5,134,294 A | | 7/1992 | Rundt et al. |
| 5,206,174 A | | 4/1993 | Gehrke et al. |
| 5,210,423 A | | 5/1993 | Arseneau |
| 5,225,682 A | | 7/1993 | Britton, Jr. et al. |
| 5,276,615 A | | 1/1994 | Edmond et al. |
| 5,304,808 A | | 4/1994 | Odell |
| 5,349,193 A | | 9/1994 | Mott et al. |

(Continued)

OTHER PUBLICATIONS

Newbury, Dale E., X-ray Mapping in the Spectrum Image Mode at Output Count Rates above 100 kHz with the Silicon Drift Detector (SDD), Microsc Microanal 12 (Supp 2), 2006, 2 pp.

(Continued)

*Primary Examiner* — Kiho Kim
(74) *Attorney, Agent, or Firm* — Eckert Seamans Cherin & Mellott, LLC; Philip E. Levy, Esquire

(57) ABSTRACT

A method of adjusting a response of an energy measuring filter, such as an FIR filter, of a pulse processor based on a slope of a preamplifier signal having a plurality of step edges each corresponding to a respective photon is provided that includes receiving a digital version of the preamplifier signal comprising a plurality of successive digital samples each having a digital value, the preamplifier signal having a portion defined by a first one of the step edges and a second one of the step edges immediately following the first one of the step edges, using the digital values of each of the digital samples associated with the portion to determine an average slope of the portion normalized by a length of the portion, and using the average slope of the portion normalized by a length of the portion to correct the response of the energy measuring filter.

19 Claims, 7 Drawing Sheets

U.S. PATENT DOCUMENTS

| | | | |
|---|---|---|---|
| 5,349,195 | A | 9/1994 | Dumont |
| 5,393,982 | A | 2/1995 | Mott et al. |
| 5,430,406 | A | 7/1995 | Kolodziejczyk |
| 5,684,850 | A | 11/1997 | Warburton et al. |
| 5,774,522 | A | 6/1998 | Warburton |
| 5,808,306 | A | 9/1998 | Skillicorn et al. |
| 5,873,054 | A | 2/1999 | Warburton et al. |
| 6,160,259 | A | 12/2000 | Petrillo et al. |
| 6,177,675 | B1 | 1/2001 | Gagnon et al. |
| 6,215,122 | B1 | 4/2001 | Clifford et al. |
| 6,369,393 | B1 | 4/2002 | Jordanov |
| 6,426,993 | B1 | 7/2002 | Satoh |
| 6,470,285 | B1 | 10/2002 | Atwell |
| 6,522,984 | B1 | 2/2003 | Jordanov |
| 6,525,322 | B2 | 2/2003 | Wong et al. |
| 6,525,323 | B1 | 2/2003 | Vesel et al. |
| 6,576,907 | B1 | 6/2003 | Klein et al. |
| 6,590,957 | B1 | 7/2003 | Warburton et al. |
| 6,901,337 | B2 | 5/2005 | Tanaka et al. |
| 6,936,822 | B2 | 8/2005 | Wong et al. |
| 7,045,802 | B2 * | 5/2006 | Vernon ......................... 250/526 |
| 2002/0060606 | A1 | 5/2002 | Andre |
| 2004/0158440 | A1 | 8/2004 | Warburton et al. |
| 2004/0206909 | A1 | 10/2004 | Izumi et al. |
| 2006/0015290 | A1 | 1/2006 | Warburton et al. |
| 2006/0120508 | A1 | 6/2006 | Chen et al. |
| 2006/0151707 | A1 | 7/2006 | Wellnitz et al. |
| 2006/0180767 | A1 | 8/2006 | Ramsden |

OTHER PUBLICATIONS

Guo, Weijun et al., A study of the real-time deconvolution of digitized waveforms with pulse pile up for digital radiation spectroscopy, Nuclear Instruments and Methods in Physics Research A 544 (2005) pp. 668-678.

Srinivasan, R., "Simulation of CFAR detection algorithms for arbitrary clutter distributions", IEE Proc.-Radar, Sonar Navig., vol. 147, No. 1, Feb. 2000.

\* cited by examiner

DIGITAL PULSE PROCESSOR SLOPE CORRECTION

CROSS-REFERENCE TO RELATED APPLICATIONS

This application claims the benefit of U.S. Provisional Application No. 60/963,312, entitled "DIGITAL PULSE PROCESSOR SLOPE CORRECTION", filed on Aug. 3, 2007, the disclosure of which is incorporated herein by reference.

FIELD OF THE INVENTION

The present invention relates to energy-dispersive radiation spectrometry systems, such as X-ray spectrometry systems or gamma-ray spectrometry systems, and in particular to a method for improving slope correction in a digital pulse processor of an energy-dispersive radiation spectrometry system.

BACKGROUND OF THE INVENTION

Energy-dispersive radiation spectrometry systems, such as, without limitation, X-ray spectrometry systems or gamma-ray spectrometry systems, are used for detecting, measuring and analyzing radiation emissions, such as X-ray emissions or gamma-ray emissions, from, for example, a scanning electron microscope (SEM). A typical energy-dispersive radiation spectrometry system includes the following four main components: (1) a detector, (2) a pre-amplifier, (3) a pulse processor, and (4) a computer-based analyzer. For convenience only, and not for purposes of limitation, the following description will relate to X-ray spectrometry systems and photons in the form of X-rays (as compared to, for example, photons in the form of gamma-rays that are detected in a gamma-ray spectrometry system).

The detector, which usually takes the form of a semiconductor sensor of some type, converts an incoming X-ray into a very small current pulse, typically on the order of tens of thousands of electrons, with a duration of about tens to a few hundreds of nanoseconds. The magnitude of each of the current pulses is proportional to the energy of the X-ray.

The pre-amplifier amplifies the current pulse output by the detector and typically converts it into a voltage signal in the range of tenths of millivolts up to a few hundreds of millivolts. There are two main types of preamplifiers: "tail pulse" or RC-coupled preamplifiers, and pulsed-reset preamplifiers. In a pulsed-reset type of preamplifier, the charge generated in the sensor is integrated in a feedback capacitor such that the resulting voltage increases in steps of varying heights and intervals, until it reaches an upper limit. When that limit is reached, a "reset" pulse is applied which drains the accumulated charge from the feedback capacitor, restoring the preamplifier to near its minimum output voltage in a short time, typically a few microseconds. Then, charge due to the interaction of X-rays with the detector accumulates on the feedback capacitor again, and the cycle repeats. In contrast, tail-pulse preamplifiers act as high-pass filters on the voltage step signal output by the detector, with an exponential return to baseline whose time constant is long compared to the charge integration time in a feedback capacitor of the preamplifier. The subject matter described elsewhere herein applies to pulsed-reset preamplifiers.

The pulse processor receives the pre-amplifier signal and generates a numeric representation of the X-ray's energy through an integration process. In older energy-dispersive radiation spectrometry systems, the pulse processor included two separate components, namely a "shaping amplifier" and an analog to digital converter. Modern energy-dispersive radiation spectrometry systems, on the other hand, typically combine these functions, with the newest designs digitizing the preamplifier signal directly and carrying out all pulse detection and filtering functions using digital signal processing. The subject matter described elsewhere herein applies to all-digital pulse processing.

The computer-based analyzer accumulates the X-ray energies output by the pulse processor into a spectrum or plot of the number of X-rays detected against their energies. The spectrum is divided into a somewhat arbitrary number of small ranges called "channels" or "bins." In older systems, a hardware component called a multi-channel analyzer (MCA) did the accumulation of X-rays into spectrum channels and a computer read out the summed result. In modern systems, the MCA function is handled in software, either by the computer or even within the pulse processor.

The job of the pulse processor is made more complex by several factors. For example, electronic noise is superimposed on the underlying signal received from the preamplifier. For X-rays that are near the lowest detectable energy level, the preamplifier output step height may be significantly smaller than the peak-to-peak excursions of the electronic noise. In such as case, the X-ray can only be detected by filtering the signal for a relatively long period of time before and after the step, to average away the contribution of the noise.

Second, the steps in the preamplifier output are not instantaneous. In the absence of noise, the signal would be a sigmoidal (S-shaped) curve. This is due to bandwidth limitations, device capacitance, and the time required for all the electrons generated by an X-ray to reach the anode of the sensor. These electrons can be visualized as a small cluster or cloud, which moves through the sensor material toward the anode under the influence of the bias voltage field within the semiconductor sensor.

In addition to the electrons generated by X-rays, there is also a slow continuous flow of electrons to the feedback capacitor of the preamplifier due to leakage. This leakage current appears as a slight positive slope in the preamplifier output even in the absence of X-rays. The amount of leakage current is a strong function of temperature in semiconductor detectors; in silicon devices, leakage approximately doubles for each 7 degree C. increase in temperature. The newest generation of commercial silicon sensors, referred to as "Silicon Drift Detectors" (SDDs), operate at much higher temperatures than traditional so called Lithium-Drifted Silicon (Si(Li)) which must be cooled to liquid nitrogen temperature for proper operation. Thus, leakage currents are much higher when SDDs are employed and the background slope in the preamplifier output is correspondingly higher as well.

The most common type of digital filter used in digital pulse processing is the so-called triangle or trapezoidal filter, which is illustrated in FIGS. 2A-2C. A triangle or trapezoidal filter simply takes an average of the preamplifier signal during a short period of time before a step edge and afterwards, possibly separated by a small gap of zero weight, and subtracts them as shown in FIG. 2A. This type of filtering is well-known in the art, and is popular because it is very easy to compute. Only four arithmetic operations are required per sample of the digitized preamplifier waveform for a continuous convolution of the filter with the digitized waveform. The response of such a convolution, as shown in the middle portion of FIG. 2C, is a triangle (possibly with a flat top if there is a gap in the filter), hence the common name for this type of filtering.

If the background slope of the signal is not zero, as shown by the dotted line in FIG. 2B, a triangular or trapezoidal filter convolved with it will have a constant response equal to the shaded area of FIG. 2B. When a step edge is superimposed, the resulting maximum response of the filter is increased by a constant amount as shown in the bottom portion of FIG. 2C. This has been known in the art for more than 30 years, and was described in 1975 by U.S. Pat. No. 3,872,287 to Koeman. If the background slope is known, the measured energy of the X-ray can be corrected for the effects of the background slope by subtracting the known response of a digital filter to the slope.

The classical method of determining the slope, as described by the '287 patent and also used in some commercial analog pulse processors, is to trigger an energy measurement artificially in the absence of an X-ray. The average response of a large number of such artificial triggerings will be the offset required to correct the energy of a response to a real X-ray. But as the '287 patent notes, this makes the assumption that the background slope is constant.

Leakage current is indeed expected to be constant if (as noted above) the sensor's temperature is held constant, but there are other potential sources of background slope in the signal which may not be constant over time. The aftereffects of a reset may induce a slow exponential change in the background slope, depending on the design of the preamplifier. Various kinds of low-frequency noise coupled into the preamplifier output, most commonly at power-line frequencies, can also cause the local slope to vary with time. The phenomenon known in the art as "microphonics" describes the coupling of acoustic signals from the environment into the preamplifier signal, as physical components of the detector assembly act as capacitive microphones. The effect of a time-varying background slope is to cause the entire spectrum, including the artificially-triggered peak, to both move up and down in energy. As a result, averaged over time, the center of the artificially-triggered peak may still represent the average offset, but the peaks will be significantly broadened by the instability of the peak positions.

U.S. Pat. No. 5,349,193 to Mott discloses a method for estimating the local slope in the neighborhood of a step edge. The '193 patent also shows the effects of slope in FIG. 6g thereof, and of time-varying slope in FIG. 6h thereof. Looking at FIG. 4 of the '193 patent, block 48 and the accompanying text describe a triangle filter used to detect edges of all energies. Block 48 is detailed in FIG. 6a, where the three arithmetic logic units (ALUs) 202, 204, and 206 make up the triangle filter, and FIFO 210 with accumulator 208 accumulate a running sum of $2^{SC}$ successive outputs of the peak-detecting filter. The filter output is also tested against an energy threshold in comparator 214, and the accumulation in FIFO 210 is blocked if the output is above threshold. In this way, only samples from the background slope are accumulated in the FIFO. The average of the slope (simply computed by bit-shifting the sum down SC bits in block 220) is used to correct the data stream before energy-measurement filters in block 52 are applied. This eliminates the need for a separate correction factor for each of the many measurement filters stored in the coefficient tables in blocks 58 and 60.

While the method described in the '193 patent is effective, there is room for improvement in the area of slope correction in digital pulse processing.

SUMMARY OF THE INVENTION

In one embodiment, a method of adjusting a response of an energy measuring filter, such as an FIR filter, of a pulse processor based on a slope of a preamplifier signal is provided. The preamplifier signal has a plurality of step edges each corresponding to a respective photon. The method includes receiving a digital version of the preamplifier signal comprising a plurality of successive digital samples each having a digital value, wherein the preamplifier signal has a portion defined by a first one of the step edges and a second one of the step edges immediately following the first one of the step edges. The method further includes determining a first integral of the digital values of the digital samples associated with a first half of the portion, determining a second integral of the digital values of the digital samples associated with a second half of the portion following the first half, determining an integral difference equal to a difference between the second integral and the first integral, determining a slope value by normalizing the integral difference by a length of the portion, and using the slope value to correct the response of the energy measuring filter.

In one particular embodiment, the portion has n ones of the digital samples associated therewith, wherein the digital values of the digital samples associated with a first half of the portion are a first group of the n ones of the digital samples, the first group being a first successive n/2 ones of the n ones of the digital samples, wherein the digital values of the digital samples associated with a second half of the portion are a second group of the n ones of the digital samples, the second group being a second successive n/2 ones of the n ones of the digital samples following the first group, wherein the first integral is an integral of the digital values of the digital samples of the first group, wherein the second integral is an integral of the digital values of the digital samples of the second group, and wherein the determining a slope value comprises determining an intermediate slope value by dividing the integral difference by n/2 and determining the slope value by dividing the intermediate slope value by n/2. Further, the first integral is preferably a sum of the digital values of the digital samples of the first group, and the second integral is preferably a sum of the digital values of the digital samples of the second group.

The slope value may a slope over one unit time. In addition, the using of the slope value may include multiplying the slope value by a half-width of the energy measuring filter to get a slope correction value and using the slope correction value to correct the response of the energy measuring filter. The length of the portion may be the number of digital samples that are associated with the portion.

In another embodiment, a pulse processor is provided that is adapted to perform the method just described. In still another embodiment, an energy-dispersive radiation spectrometry system, such as an X-ray spectrometry system or a gamma ray spectrometry system, is provided that includes a detector for converting an incoming photon into an output comprising a current pulse, a preamplifier for converting the output of the detector into a preamplifier signal comprising a voltage signal, wherein the preamplifier signal has a plurality of step edges each corresponding to a respective photon, and a pulse processor having an energy measuring filter, such as an FIR filter. The pulse processor is adapted to adjust a response of the energy measuring filter by performing the various embodiments of the method just described.

In yet another embodiment, a method of adjusting a response of an energy measuring filter, such as an FIR filter, of a pulse processor based on a slope of a preamplifier signal having a plurality of step edges each corresponding to a respective photon is provided that includes receiving a digital version of the preamplifier signal comprising a plurality of successive digital samples each having a digital value, the preamplifier signal having a portion defined by a first one of the step edges and a second one of the step edges immediately following the first one of the step edges, using the digital values of each of the digital samples associated with the portion to determine an average slope of the portion normalized by a length of the portion, and using the average slope of the portion normalized by a length of the portion to correct the response of the energy measuring filter.

Therefore, it should now be apparent that the invention substantially achieves all the above aspects and advantages. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the invention, and together with the general description given above and the detailed description given below, serve to explain the principles of the invention. As shown throughout the drawings, like reference numerals designate like or corresponding parts.

DESCRIPTION OF THE PREFERRED EMBODIMENTS

The subject matter described herein applies to energy-dispersive radiation spectrometry systems generally. However, for ease of illustration and description, the invention will be described in connection with embodiments that employ an X-ray spectrometry system. This is not to be considered to be limiting, and it is to be understood that the invention may be applied in connection with other types of energy-dispersive radiation spectrometry systems, such as, without limitation, gamma-ray spectrometry systems.

The present invention improves significantly on the design disclosed in the '193 patent described above. It can be shown that averaging a series of filter outputs is mathematically equivalent to estimating the slope from only two small regions for each interval between X-rays, one at the beginning and one at the end, as follows. Consider the shortest possible peak-detecting filter, consisting of one ADC sample weighted −1 and the adjacent ADC sample weighted +1. Label the successive ADC samples between any pair of X-ray edges as $A_1, A_2, A_3$, and so forth. Then the first "filter" output of the convolution will be $A_2-A_1$. The second output will be $A_3-A_2$, the third output $A_4-A_3$, and so forth up to $A_n-A_{n-1}$, where "n" is the number of ADC samples between the X-ray step edges. It should be clear that if this series is summed, all the terms cancel except $A_n$ and $A_1$, and the final sum is $A_n-A_1$.

If the integration period of each half of the peak-detecting triangle filter (half-width) is increased to 2 ADC samples, the series becomes:

$$(A_4+A_3-A_2-A_1)+(A_5+A_4-A_3-A_2)+(A_6+A_5-A_4-A_3)+\ldots+(A_n+A_{n-1}-A_{n-2}-A_{n-3})$$

Again, all the intermediate terms cancel and we are left with:

$$A_n+2A_{n-1}+A_{n-2}-A_1-2A_2-A_3$$

The key point is that the slope samples represented by the successive outputs of the triangle filter are not independent estimates of the slope. Because of that, the estimate collapses to a calculation based on the weighted average of a few ADC samples at the beginning and the end of each interval between X-ray steps depending on the half-width of the triangle filter, as discussed above. Therefore, most of the information in the samples between the X-ray step edges is not being used. The present invention forces the outputs used in slope estimation to be independent, in order to make best use of all the available information, as will be shown in detail below.

Figure 3:
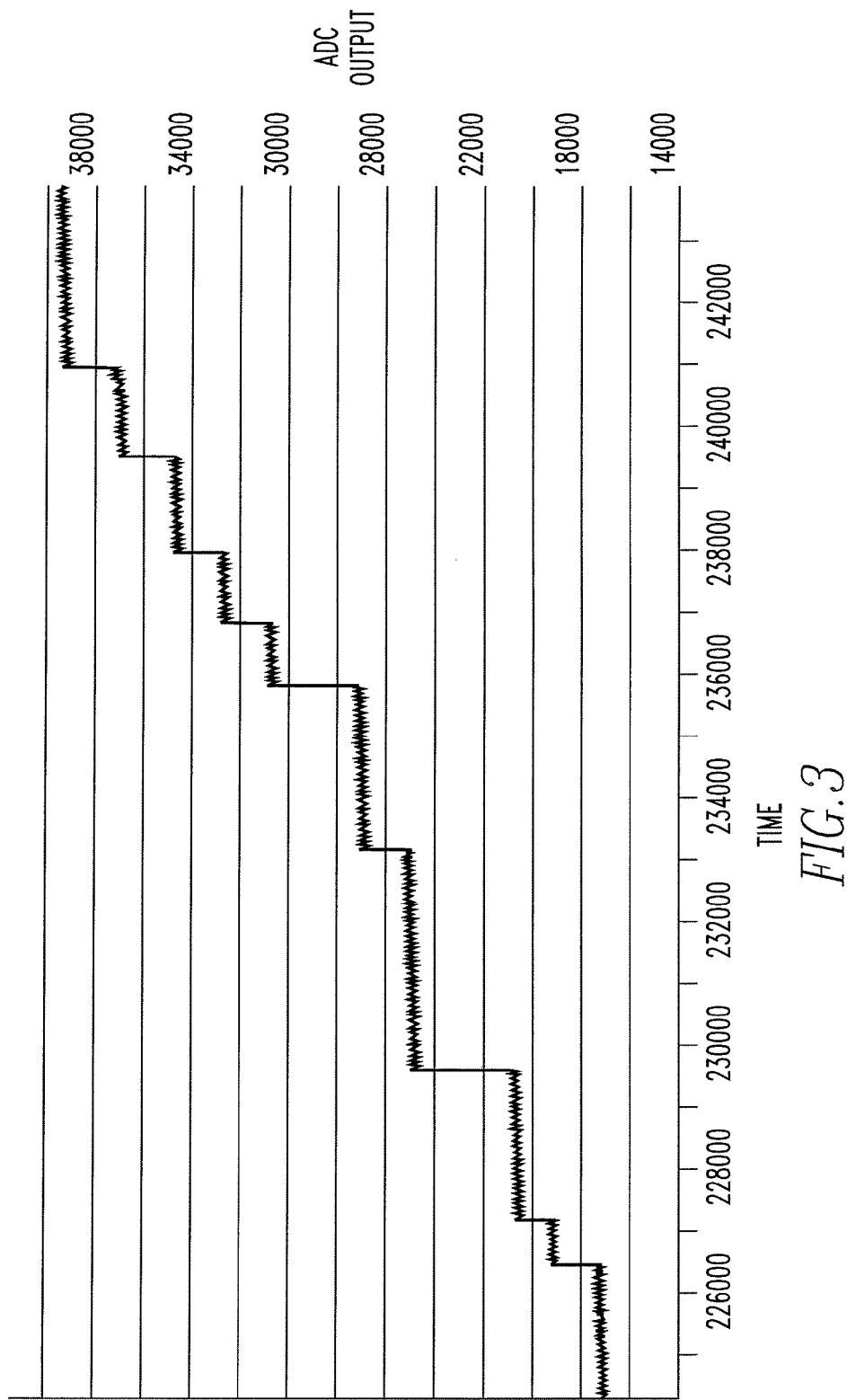
FIG. 3 shows a signal from an SDD-type detector and a pulsed-reset preamplifier.

The subject described herein provides a novel method of making the estimate of the instantaneous slope under a step edge with significantly improved accuracy at high counting rates, in the possible presence of time-varying background slope in the preamplifier signal. FIG. 3 shows a real signal from an SDD-type detector and a pulsed-reset preamplifier. The intervals between step edges vary widely, as is well known in the art. The subject described herein makes use of the width of the intervals to make a better estimate of the local slope, as will be described in detail below.

As just noted, an object of the invention is to measure the slope underlying step edges in the output of a pulsed-reset preamplifier of a semiconductor radiation detector as accurately as possible in real time, and use that estimate to correct the measured energies for any error due to the background slope. The method is robust in the presence of low-frequency time variations in the slope.

In addition, the method is digitally based, and thus in the disclosed embodiment requires the preamplifier signal to be digitized by an analog-to-digital converter (ADC). The description which follows assumes a positive-going preamplifier output when X-rays are detected, but it will be obvious to those of ordinary skill in the art that the polarity of the signals could be reversed throughout the signal chain and the method would be equally effective. It also assumes a Silicon-based sensor and radiation in the low X-ray energy range, but again those of ordinary skill in the art will understand that the method described applies to sensors made of other semiconductors such as Germanium, and to photons of higher-energy X-rays or Gamma rays.

Figure 1:
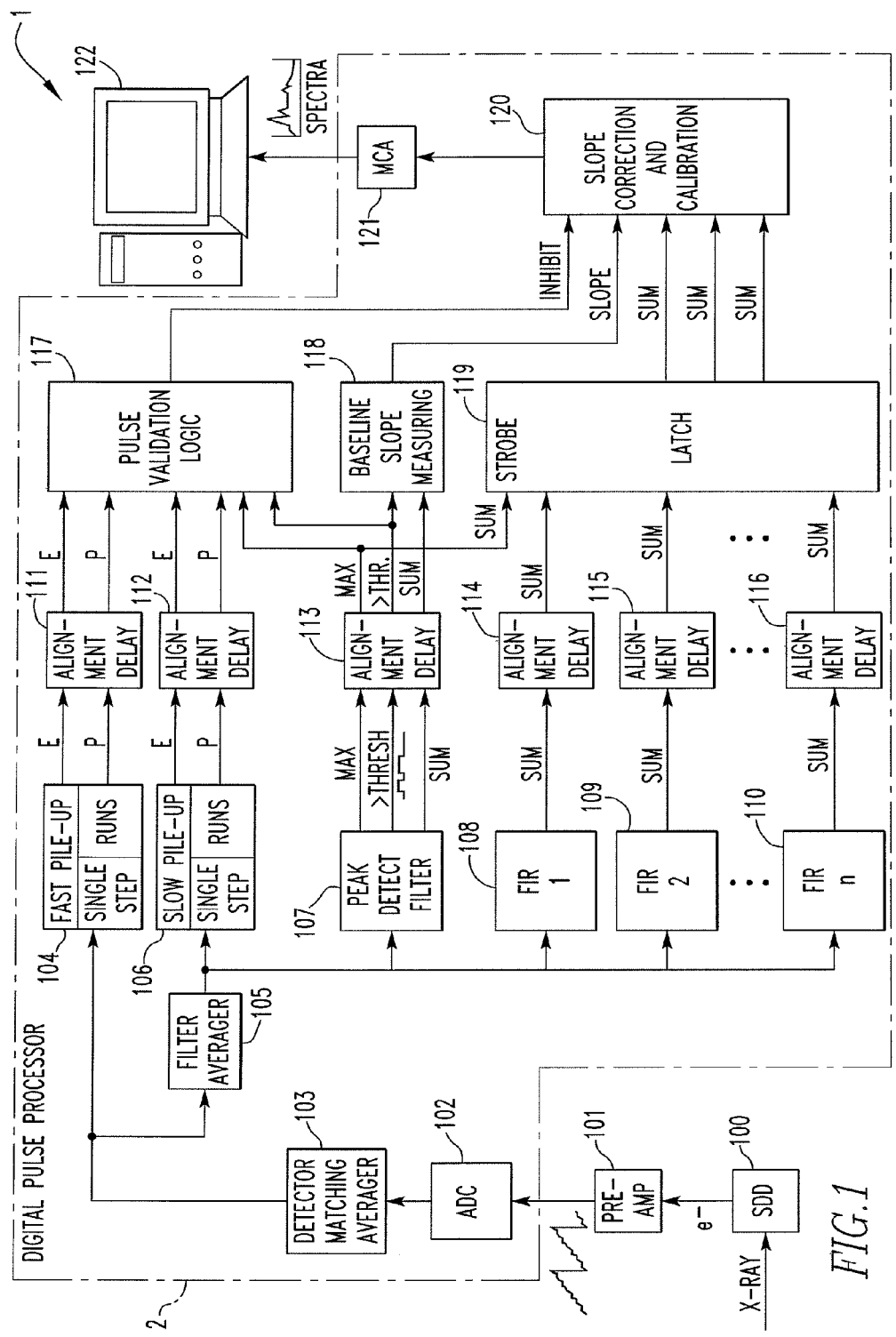
FIG. 1 is an overall block diagram of an X-ray spectroscopy system according to one particular, non-limiting embodiment in which the present invention may be implemented.

FIG. 1 is an overall block diagram of an X-ray spectroscopy system 1 according to one particular embodiment in which the present invention may be implemented. As seen in FIG. 1, the X-ray spectroscopy system 1 includes as a main component thereof a digital pulse processor (DPP) 2, shown by a dotted line boundary, in which the present invention is implemented as described herein. In addition, the X-ray spectroscopy system 1 further includes a silicon drift detector (SDD) 100 and a pulsed reset-type preamplifier 101. Only the logic blocks of the DPP 2 that are relevant to the present invention are described in detail. The blocks that are functionally equivalent to similar blocks in the prior-art patents cited will be clear to those of ordinary skill in the art.

In operation, an X-ray strikes the SDD 100 and is converted into electron-hole pairs, the number of electrons being proportional to the energy of the X-ray. The small charge consisting of the total of these electrons is accumulated on a capacitor in the preamplifier 101 and is converted into an output voltage signal of the form shown, in which small sigmoidal steps occur with varying amplitudes and intervals superimposed on noise. The voltage signal has an overall positive slope due to leakage current in the SDD 100, with periodic resets which drain the charge from the feedback capacitor and force the output quickly to its lower limit, resulting in the sawtooth-like waveform shown in FIG. 1. This general approach has been known in the art for many years.

The output of the preamplifier 101 is digitized by a high-speed Analog-to-Digital Converter (ADC) 102 provided as part of the DPP 2. In a preferred embodiment, the ADC 102 is a 100 Mhz, 16-bit part made by Analog Devices such as the AD9446 series. The preferred embodiment, which is shown in FIG. 1, places logic blocks 103 through 119, named and described in greater detail below, in FPGA logic, and logic blocks 120 and 121, also named and described in greater detail below, in DSP chip software.

The output of the ADC 102 consists of digital samples from the preamplifier voltage waveform and a clock which defines the timing for all subsequent blocks in FIG. 1. In order to simplify FIG. 1, the clock is not shown separately, but all function blocks should be understood to be synchronized by the clock of the ADC 102 or some sub-multiple of it as described below.

The output of the ADC 102 and its clock go through a detector matching averager 103, which optionally sums a number of ADC samples and divides the original ADC clock by the same number. The purpose of the detector matching averager 103 is to optimize the effective sampling interval with respect to the rise time of the SDD 100 connected to the DPP 2. Retaining all bits in the sum is preferred in order to avoid quantization errors in the final X-ray spectrum at very short filtering times, so the data paths get wider as processing continues through the DPP 2.

If the average rise time expected from the SDD 100 is less than about 150 nS, the detector matching averager 103 is disabled and the full 100 Mhz rate is used in order to obtain the best possible timing precision. However, if a much slower detector such as the so-called lithium-drifted silicon or Si(Li) detector with planar electrodes is connected to the DPP 2, and the average rise time is several hundreds of nS, it is desirable to reduce the effective sampling rate to that which produces fewer than about 16 samples in the average rise.

The (possibly summed) data and clock from the detector matching averager 103 are passed through two parallel paths. One path leads to fast pile-up logic 104 which has two sub-sections. The first sub-section is referred to as single-step logic, and the other sub-section is referred to as runs logic. The single-step logic is capable of detecting X-ray pile-ups within a single continuous rise for moderately high energy X-rays, and the runs logic is designed to detect the end of a continuous rise due to a low-energy X-ray as quickly as possible within constraints of noise. These logic sections are described in detail in co-pending application Ser. Nos. 12/184,834 and 12/184,624, each entitled "PILEUP REJECTION IN AN ENERGY-DISPERSIVE RADIATION SPECTROMETRY SYSTEM" and filed of even date herewith.

The second path leads to a filter averager 105. The filter averager 105 sums a small number of successive ADC samples, preferably 4, to reduce the noise (random fluctuations from sample to sample) and also reduce the speed required in subsequent digital processing steps. The summed-by-4 data and the divided-by-4 clock are passed to slow pile-up logic 106. The slow pile-up logic 106 is functionally identical to the fast pile-up logic 104, but with less noisy and slower data.

The output from the filter averager 105 is also passed in parallel to a peak detect filter 107, and a plurality of trapezoidal FIR digital filters 108, 109, 110. All of these filters are of the conventional trapezoidal type, as has been commonly used in the art for at least 15 years. Triangle (or trapezoidal) filter shapes are popular because of the simple circuitry required to compute them. Only four computations are required per FIFO clock cycle for an FIR filter of arbitrary total length.

The peak detect filter 107 is not concerned with measuring the X-ray's energy, but with detecting all X-rays, even those of very low energy, and locating them as accurately as possible in time. The width of its rise and fall FIFOs is made as short as possible while still reliably detecting the lowest-energy X-ray emission line in the spectrum being collected. For X-ray analyzers mounted on electron microscopes, that is often the carbon emission line at 277 electron volts (eV). Hence the peak detect filter 107 is often referred to as the "carbon filter" in U.S. Provisional Application No. 60/963,320, entitled "IMPROVED EDS PILEUP REJECTION FOR LOW ENERGIES AT HIGH COUNT RATES", filed on Aug. 3, 2007, to which the above described applications claim priority. The minimum target emission line may be lower in energy (boron or beryllium), or higher in the case of detectors for X-ray fluorescence (XRF) excitation, which is very inefficient at low energies. XRF detectors are usually equipped with beryllium windows in front of the sensor, which block essentially all X-rays below about 700 eV. In that case, the peak detecting filter 107 can be made narrower without fear of missing significant numbers of X-rays, which improves its performance for pile-up detection.

The FIR filters 108, 109, 110, which are for measuring X-ray energy levels, the peak detect filter 107, the slow pile-up logic 106 and the fast pile-up logic 105 are all connected to appropriately sized programmable-length alignment delay FIFOs 111, 112, 113, 114, 115, 116 such that for a noise-free single X-ray pulse of sufficient energy to trigger all edge (event) detectors, the edge (event) locations (times) from the fast and slow pile-up logic 104, 106, the maximum of the peak detect filter 107, and the output data corresponding to the center of the gap for all energy-measuring FIR filters 108, 109, 110 will arrive at pulse validation logic 117, baseline slope measuring logic 118 and filter latch logic 119 at the same time (within the time quantization limit imposed by the clock division of the filter averager 105). It may also be desirable for the delay to the baseline slope measuring logic 118 to be delayed less than the other signals; the effect of this is that some portion of the estimated slope is measured from a time later than the X-ray edge being measured. In U.S. Pat. No. 5,393,982 to Mott, at column 16, the delay differential is such that the X-ray edge being measured is centered in the slope measurement interval. This minimizes the error in the presence of some curvature of the slope due to low-frequency interferences such as microphonics, discussed above.

The filter latch logic 119 grabs the outputs of all FIR filters which correspond to the aligned maximum-output time of the peak detect filter 107. It is the functional equivalent of the sample-and-hold circuit of classical analog pulse processing. Its outputs are delayed by an additional period corresponding to half the FIR pulse width (fall time plus half the gap time) of the longest FIR filter in the energy-measurement filter stack, to allow time for detection of pile-ups following the edge which triggered the latch.

The filter latch logic 119 also contains timers to measure the time from the current strobe signal to the preceding and following strobe signals (maximum-output pulses from peak detect filter 107), in order to allow selection of the longest filter in the FIR stack (if any) which can be used without pile-up according to the methods disclosed in U.S. Pat. No. 3,872,287 to Koeman and U.S. Pat. No. 5,393,982 to Mott. The outputs of all filters shorter than this maximum may also be combined with differing weights to achieve a better estimate of the X-ray's energy, again according to the method taught in the '287 patent.

The pulse validation logic 117 combines the signals from the fast pile-up logic 104, the slow pile-up 106 and the peak detect filter 107 to determine if a pile-up has occurred within a single output pulse from the peak detect filter 107. If such a pile-up has occurred, which will not be detected by the filter latch logic 119 because only one maximum output pulse will be generated by the peak detect filter 107, an inhibit pulse is generated and appropriately delayed to arrive at the same time the output of filter latch logic 119 reaches slope correction and calibration logic 120.

The baseline slope measuring logic 118 measures the positive slope due to leakage current of the voltage signal of the preamplifier 101 in the absence of a sigmoidal step due to an X-ray's arrival. It is well-known in the art that trapezoidal FIR filters have a constant response to a linear slope which depends on the width of the filter's integration time and gap. This slope response must be subtracted from the filter's output to obtain an accurate measure of the X-ray's energy. The baseline slope measuring logic 118 shown in FIG. 1 implements the slope measurement method of the present invention in one particular embodiment. Once the background slope is accurately measured, various methods of using it to correct the output of the energy-measuring filters are well described in the prior art.

At high counting rates, when the interval between X-rays is short on average, the slope between any two X-ray step edges is assumed to be approximately a straight line. In FIG. 3, which shows a real signal from an SDD-type detector and a pulsed-reset preamplifier, the horizontal axis is in time units of 10 nS, and the full scale of the display is 20,000 units, or 200 uS. We can see 10 step edges in this signal (note the very low-energy step edge just to the left of the rightmost obvious edge, at about t=241,000 units), so the average interval between X-ray step edges is therefore about 20 microseconds and the average incident count rate on the detector is roughly 50,000 counts per second (cps). The expected sources of low-frequency variation in the background slope are much slower, so the straight line local approximation between X-rays is valid.

Figure 4A:
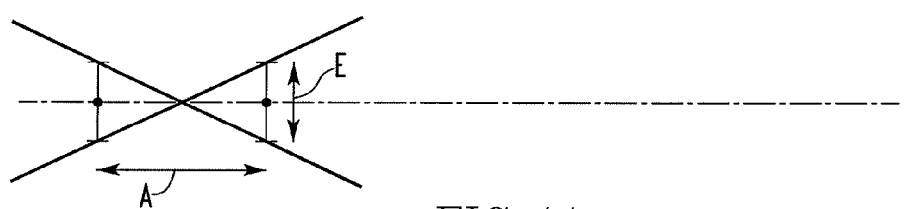
FIGS. 4A and 4B are schematic illustrations showing errors involved with slope estimates.
Figure 4B:
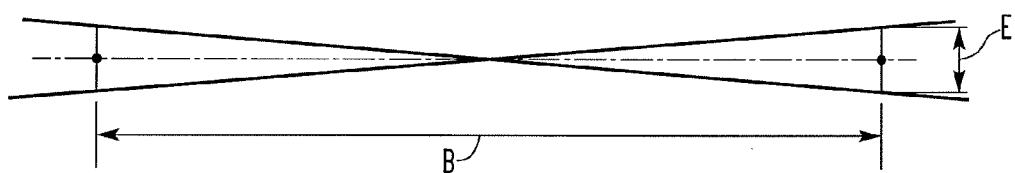

A straight line is determined by two points. The accuracy of a slope estimate depends on two independent factors, as illustrated in FIGS. 4A and 4B: the vertical error, or peak-to-peak noise excursion, at the chosen points, and the time between them. The range of possible measured slopes is determined by connecting the worst-case positive deviation for the earlier point to the worst-case negative deviation for the later point, and vice versa, as drawn. For a given vertical error 'E', this range is smaller for longer time intervals between the points. The slope estimate limits in FIG. 4B, with a longer separation interval 'B', are narrower than for the shorter interval 'A' in FIG. 4A.

The vertical error, designated 'E' in FIGS. 4A and 4B, is a function of the number of ADC samples averaged to determine the value at the designated point in time. That error can be reduced by averaging more samples (reducing the P-P noise).

Consider a segment of baseline slope between two X-ray edges and assume for the moment that the actual slope is zero, as shown by the dashed lines in FIGS. 4A and 4B. If only two measurement points of one ADC sample each per interval could be use, they should be right after the previous edge and right before the following edge to maximize the slope estimation baseline. If two ADC samples for each point can be averaged, they should be the two ADC samples closest to the right-hand step and the two ADC samples closest to the left-hand step.

If that argument is followed to its logical conclusion, the most accurate slope measurement which uses all available samples between two X-ray step edges computes the average of the second half of the samples and subtracts the average of first half. The method disclosed in U.S. Pat. No. 5,393,982 to Mott gives the optimum separation at the ends of the interval between X-rays, but the number of samples in the weighted average is limited as described above to approximately the half-width of the peak detecting filter at either end. As previously noted, it is desirable to minimize the half-width of the peak-detecting filter, consistent with the requirement to detect all significant X-ray emission lines, in order to maximize potential throughput count rate. For a current-generation SDD, the desired energy measurement half-width might be on the order of 2 microseconds for a good compromise between energy resolution and throughput; therefore the peak detecting filter must have a half-width of 1 microsecond or less. Thus, on average, the method described herein of using the first and second halves of the samples in each interval will improve the accuracy of slope estimation for the real-world data stream shown in FIG. 3 by effectively using about 10 times as much data per X-ray interval as the prior art technique.

After detecting one X-ray, it is not known when the next X-ray is going to occur so it is not known in advance how long the interval between X-ray step edges is going to be. Fortunately, it is possible to compute a close approximation to the desired sum in real time with the simple circuit arrangement shown in FIG. 5 (which may be employed in the baseline slope measuring logic 118 of FIG. 1). The mathematical explanation for the result is shown schematically in FIG. 6.

Figure 5:
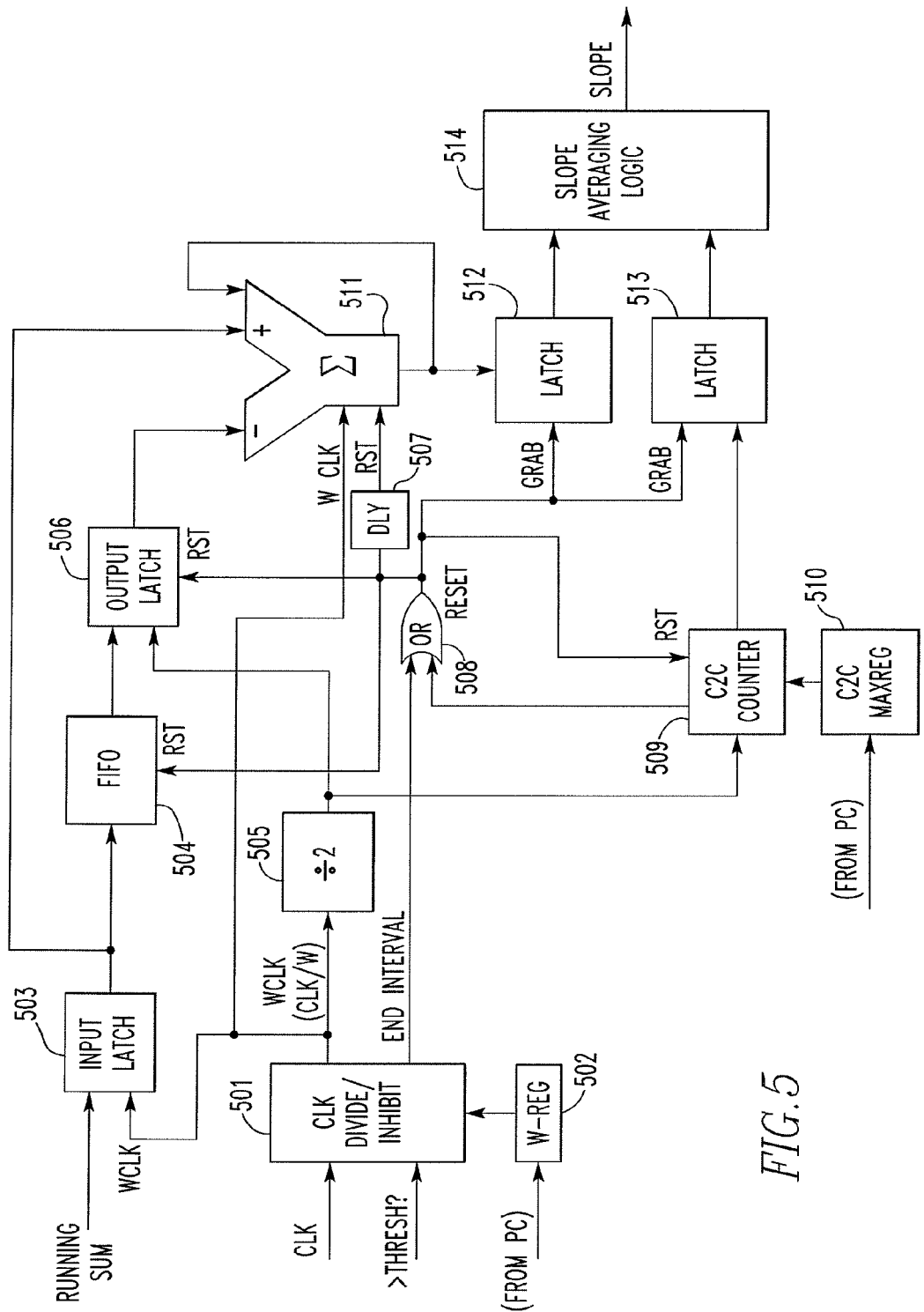
FIG. 5 is a schematic diagram of a circuit that may be used to calculate the ADC sample sums employed in the present invention.

In FIG. 5, the "running sum" which is captured by an input latch 503 is the sum of one or more ADC samples, which as discussed above for the system of FIG. 1 may already by summed by previous stages in the detector matching filter 101 and the filter averager 104. In a preferred embodiment, for an SDD-type detector, the detector matching filter 101 is disabled (set to 1) and the filter averager 104 is set to 4 (sum 4 original ADC samples and divide the original 100 Mhz clock by 4). Also in that preferred embodiment, the running sum is the continuously updated sum of ADC samples used as the right-hand (trailing) half of the peak detect filter 107, which has a user-controlled half-width of W ADC samples. Note that these are 40-nS ADC samples summed from 4 of the original 10-nS ones.

Figure 2A:
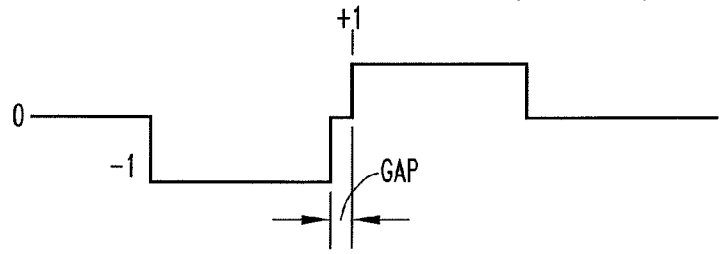
FIGS. 2A-2C are schematic illustrations of a triangle or trapezoidal filter.
Figure 2B:
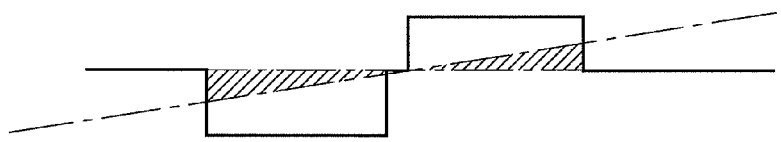
Figure 2C:
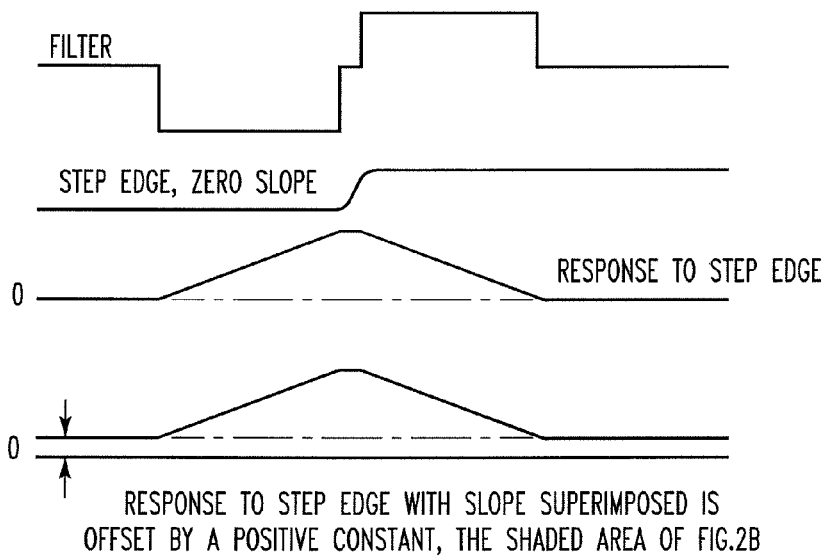

There is no reason to use a value for W smaller than the half-width of the peak detect filter 107. Intervals between X-rays shorter than the full width of the peak detect filter 107 will be rejected immediately as pile-up as discussed above and in U.S. Pat. No. 5,393,982 to Mott. A minimum of two groups of W ADC samples is needed to get a slope estimate, which is equivalent to the full width just described. So the shortest measurable interval between X-rays corresponds to two half-widths of the peak detect filter 107. It is also convenient that the running sum of W ADC samples must already be calculated as part of the computation for the peak detect filter 107 as seen in FIG. 2 of co-pending application Ser. Nos. 12/184,834 and 12/184,624 described above and incorporated herein by reference.

The clock signal entering clock divide/inhibit logic 501 may also be divided down by the detector matching filter 103 and the filter averager 104 as shown in FIG. 1. It is further divided by W to create a new clock WCLK which is used to trigger the input latch 503 every W cycles of the entering clock. This ensures that successive entries in the FIFO 504 are statistically independent, which is desirable as discussed above. The value of W is placed in a W-REG register 502 by an external controlling computer.

The signal "above threshold" shown in FIG. 1, generated by the peak detect filter 107 (which is high whenever the peak detect filter 107 is above its threshold energy), is used to signal the end of an interval between X-rays (i.e. the detection of a new X-ray arrival). It passes through an OR gate 508 and triggers latches 512 and 513 to capture the outputs of an accumulator 511 and a C2C Counter 509 respectively. It also clears the FIFO 504 and the output latch 506. After a brief delay in delay 507 to allow the latch 512 time to capture the value held in the accumulator 511, the accumulator 511 is also cleared.

The WCLK is passed though a divide-by-2 circuit 505 to generate a half-rate clock. While the FIFO 504 is filled at the WCLK rate, the output latch 506 only takes entries out of it at half that rate. The accumulator 511, which runs at WCLK rate, thus subtracts every output of the FIFO 504 from the cumulative sum twice.

C2C stands for "center-to-center". This will be the time in WCLK units between the center of the first group of ADC samples used to estimate the slope and the center of the second group. The C2C Counter 509 is initialized to 1 and incremented on every WCLK cycle. Because the interval between two X-rays can be arbitrarily long, depending on the average count rate and Poisson arrival statistics, there is an artificial maximum placed on the C2C value in C2C MAXREG register 510, which is loaded from an external control computer. When the C2C Counter 509 reaches the value of C2C MAXREG register 510, a signal is generated which enters the OR gate 508 and generates cumulative-sum and C2C length outputs for the slope averaging logic 514.

As discussed below in connection with FIG. 7, the total time over which the slope is estimated is defined by an average over a programmable number of single-interval slope estimates. Since it is desirable to limit that total averaging time, in order to track variations in the background slope accurately, a value was chosen for the C2C MAXREG register 510 which makes the total averaging time long with respect to the energy-measuring filter width, but short with respect to the highest expected frequency of the sources of background slope variability such as power-line voltage and microphonics.

FIG. 5 shows the logic for steady-state operation of the calculation for deriving the necessary sums for estimating the slope of a single interval between X-rays (subject to the maximum length limit of the C2C MAXREG register 510). There is initialization logic which must be executed at the start of an interval, triggered by the falling edge of the "above threshold" signal. While it is not shown in FIG. 5 for clarity, its design will be apparent to those of ordinary skill in the art from the following description.

The entry of data to the FIFO 504 must be delayed for one half-width W of the peak detect filter 107 after the "above threshold" signal goes low, for the following reason. An X-ray of the lowest energy detectable will only go above threshold very briefly at the center of the full width of the peak detect filter 107. Therefore, immediately after the "above threshold" signal goes low, there may still be a low-energy edge within the trailing half-width of the filter. Therefore, a further time W must elapse while "above threshold" remains low to be certain no edge is contained in the trailing half-width. Because of this restriction, in general an interval of 1.5 full widths of the peak detect filter 107 is needed to make a valid slope estimate. Shorter intervals will be ignored. This is handled within the clock divide/inhibit logic 501.

At the end of an X-ray interval, when "above threshold" goes active, since the trailing half-width is being used, it is already known that there must be no edge within it so no special action needs to be taken. Also, at the start of the X-ray interval, the first sample entering the FIFO 504 must be forced to be loaded immediately into the output latch 506, as will become clear in connection with FIG. 6.

Figure 6:
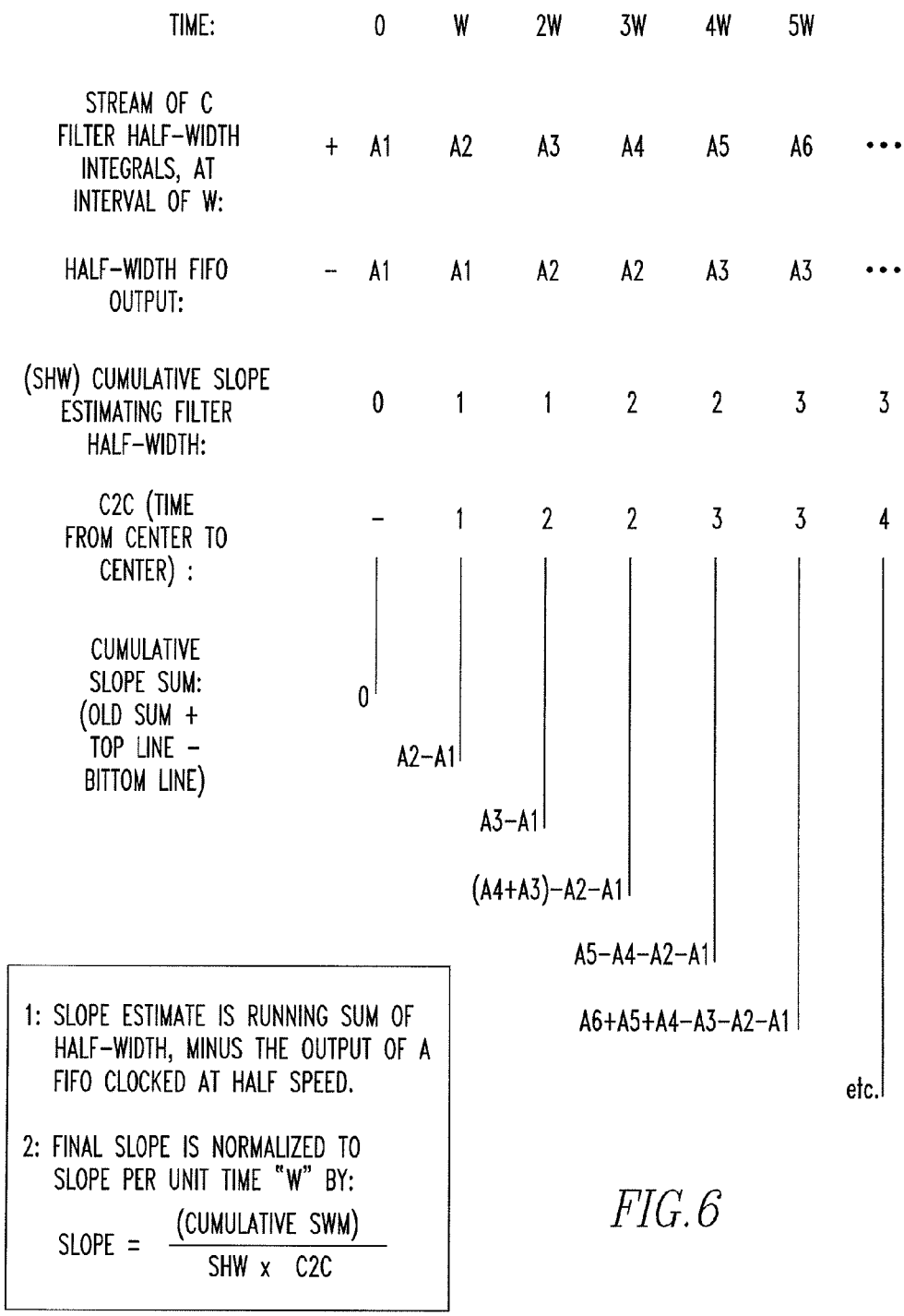
FIG. 6 is a schematic diagram illustrating a mathematical explanation for the result obtained by the circuit of FIG. 5.

FIG. 6 shows the contents of the accumulator 511 during the first few cycles of WCLK. The values of the running sum (which is the trailing half-width of the peak detect filter 107) at intervals of WCLK are referred to as A1, A2, A3 and so on in the same notation used in discussing the prior art of the '193 patent, and are shown in the top line. The contents of the output latch 506 on successive WCLK cycles are shown on the second line. A1 must be preloaded into the output latch 506 as noted above.

The third line of FIG. 6 gives the half-width of the final sum at each WCLK cycle, which will be seen to be the integer part of the number of WCLK cycles divided by 2. The fourth line of FIG. 6 is the current value of the C2C counter 509, and is the distance from center to center of the two groups of W ADC samples which make up the first and second halves of the current slope-estimating interval. This is the interval discussed in FIG. 4 which allows the slope per unit time to be computed. The longer this becomes, the more accurate the estimate. For odd-numbered cycles of WCLK, the total number of half-widths W in the first and second half-interval sums remains constant, but the time difference between their centers (C2C) increases by 1. For even-numbered cycles, C2C stays constant but the number of half-widths W used increases by 1.

The remaining lines of FIG. 6 show the cumulative sum contained in the accumulator 511. After one WCLK cycle, the sum is A2−A1, equal to the output of the peak detecting filter 107. After two WCLK cycles, the sum is A3−A1 as the value of A2 which was added after the first cycle is subtracted again, and C2C increases to 2.

On the next WCLK cycle, the contribution of A2 goes from canceled to negative while A4 is added. So it is seen that the cumulative sum is now the sum of the second (in time) half of the interval so far, minus the first half. In two more cycles, there is a total interval length of 6 times W, a center-to-center distance of 3 times W, and a cumulative sum of (A6+A5+A4)−(A3+A2+A1). The pattern continues until the arrival of the next X-ray as triggered by the rising edge of the "above threshold" signal.

Thus it is shown that the circuit of FIG. 5 provides the difference between the integral of the first half and the integral of the second half of the ADC samples making up the interval between two X-rays, and the value C2C needed to normalize that difference to the slope per unit time, without knowing in advance the length of the interval. As discussed above, this results in the most accurate straight-line estimate possible using substantially all of the available information in the interval.

Figure 7:
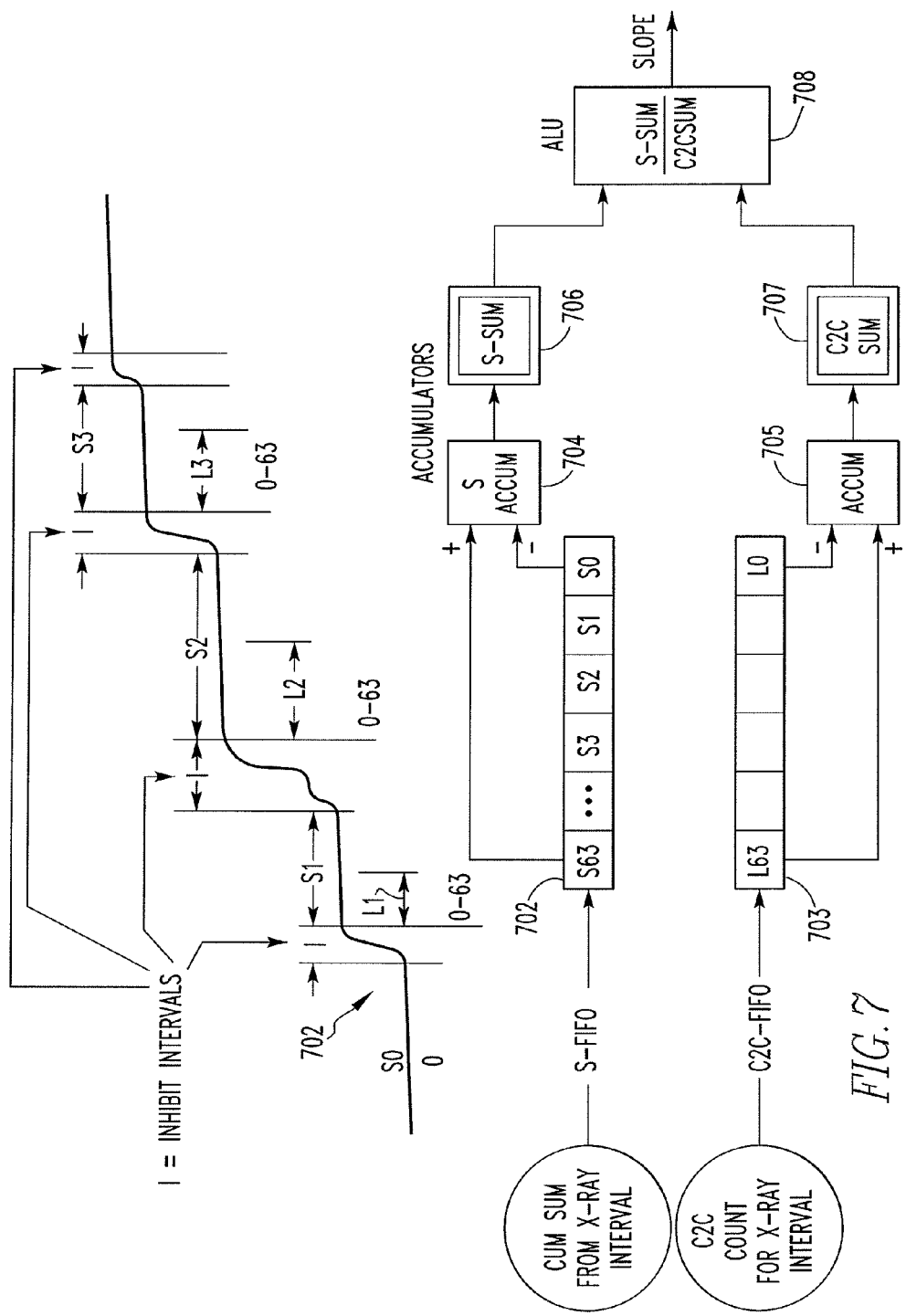
FIG. 7 is a schematic diagram illustrating the contents of the accumulator of the circuit of FIG. 5.

FIG. 7 shows the slope averaging logic 514 of FIG. 5, and illustrates the handling of the slope estimates from multiple intervals between X-rays to generate the final average slope estimate. The waveform sketch 701 at the top of FIG. 7 shows the inhibit times marked "I" surrounding the X-ray step edges, including a longer inhibit surrounding an interval less that 1.5 W as discussed above.

The cumulative slope-estimation sums for single intervals between X-rays and their corresponding C2C lengths are fed to two parallel FIFOs, the S-FIFO 702 and the C2C-FIFO 703. The exact length of these FIFOs is not critical, but should be at least 50-100 so that the total time over which the slope is averaged is long compared to the energy-measuring time. In a preferred embodiment, the length is 64, the C2C MAXREG register 510 is also 64, and W is 8 for a filter averager 104 setting of 4 and a detector matching averager 103 setting of 1. This means each unit of time W is 8×40 or 320 nS. Since the C2C value is approximately half the interval between X-rays, a limit of 64 means a maximum measured interval of 128 times W. So the maximum total time used in slope averaging is 320 nS times 64 times 128, or about 2.6 milliseconds.

The actual total will be less than that at high rates, as the average interval between X-rays may be much shorter than 128 times W. In the example of FIG. 3, for which the average interval is 20 microseconds, the total time used for slope estimation will be closer to (64×20) or 1.2 milliseconds. The total time spanned in making this estimate will be longer, because the time used does not include the cumulative inhibit intervals. However, these will be a comparatively small fraction except at extreme count rates.

The individual cumulative slope estimate sums in the S-FIFO 702 and the C2C-FIFO 703 are themselves summed in an S-Accumulator 704 and a C2C-accumulator 705, respectively. Whenever a new value is entered in the FIFOs, the current accumulator values are latched into S-SUM 706 and C2C SUM 707, respectively. The current value of the slope estimate per unit time W is generated by dividing S-SUM 706 by C2C-SUM 707 in arithmetic logic unit (ALU) 708.

It should be noted that the longer intervals between X-rays are weighted more heavily in the slope estimate, since they contribute a larger fraction of the C2C-SUM 707. This is desirable because, as noted above and shown in FIGS. 4A and 4B, longer slope estimates are more accurate.

Returning to FIG. 1, the slope correction and calibration logic 120 receives a current slope estimate from the baseline slope measuring logic 118, the outputs of all energy-measuring FIR filters 108, 109, 110, and possibly an inhibit signal from the pulse validation logic 117, all appropriately time aligned. In a preferred embodiment, these functions are implemented in software in a digital signal-processing chip such as the Texas Instruments TMS320C6414, since these events occur at the pulse rate of the peak detect filter 107, which is much lower than the ADC sampling rate.

In the absence of an inhibit signal, this logic subtracts the error due to the baseline slope in the signal from the 102 in a manner well-known in the art, and weights the raw outputs of one or more of the FIR filters 108, 109, 110 to generate a calibrated energy estimate for the X-ray which produced the step edge.

As noted in the '193, it may also be advantageous to delay the energy measurement such that the time used in slope estimation is roughly centered around the time of energy measurement. This is desirable if there is some variability in the slope.

These measured energies are stored in a Multi-Channel Analyzer (MCA) memory 121, again in a manner well-known in the art. The spectrum accumulated in the MCA 121 is then passed to a host PC 122 for analysis.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A method of adjusting a response of an energy measuring filter of a pulse processor based on a slope of a preamplifier signal having a plurality of step edges each corresponding to a respective photon, comprising:
   receiving a digital version of said preamplifier signal comprising a plurality of successive digital samples each having a digital value, said preamplifier signal having a portion defined by a first one of said step edges and a second one of said step edges immediately following said first one of said step edges;
   determining a first integral of the digital values of the digital samples associated with a first half of said portion;
   determining a second integral of the digital values of the digital samples associated with a second half of said portion following said first half;
   determining an integral difference equal to a difference between said second integral and said first integral;
   determining a slope value by normalizing said integral difference by a length of said portion; and
   using said slope value to correct the response of said energy measuring filter.

2. The method according to claim 1, wherein said portion has n ones of said digital samples associated therewith, wherein the digital values of the digital samples associated with a first half of said portion are a first group of said n ones of said digital samples, said first group being a first successive n/2 ones of said n ones of said digital samples, wherein the digital values of the digital samples associated with a second half of said portion are a second group of said n ones of said digital samples, said second group being a second successive n/2 ones of said n ones of said digital samples following said first group, wherein said first integral is an integral of the digital values of the digital samples of said first group, wherein said second integral is an integral of the digital values of the digital samples of said second group, and wherein said determining a slope value comprises determining an intermediate slope value by dividing said integral difference by n/2 and determining said slope value by dividing said intermediate slope value by n/2.

3. The method according to claim 2, wherein said first integral is a sum of the digital values of the digital samples of said first group, and wherein said second integral is a sum of the digital values of the digital samples of said second group.

4. The method according to claim 1, wherein said slope value is a slope over one unit time.

5. The method according to claim 4, wherein said using comprising multiplying said slope value by a half-width of said energy measuring filter to get a slope correction value and using said slope correction value to correct the response of said energy measuring filter.

6. The method according to claim 1, wherein said energy measuring filter is an FIR filter.

7. The method according to claim 1, wherein said length of said portion comprises a number of said digital samples that are associated with said portion.

8. The method according to claim 1, wherein said preamplifier signal has one or more additional portions, each additional portion being defined by a respective first additional one of said step edges and a respective second additional one of said step edges immediately following said first additional one of said step edges, wherein the method further comprises determining one or more additional slope values by, for each said additional portion: (i) determining a first integral of the digital values of the digital samples associated with a first half of the additional portion; (ii) determining a second integral of the digital values of the digital samples associated with a second half of the additional portion following said first half of said additional portion; (iii) determining an integral difference associated with the additional portion equal to a difference between the second integral associated with the additional portion and the first integral associated with the additional portion; and (iv) determining an additional slope value for the additional portion by normalizing said integral difference associated with the additional portion by a length of the additional portion, and wherein said using said slope value to correct the response of said energy measuring filter comprises determining an average slope value using said slope value and said one or more additional slope values and using said average slope value to correct the response of said energy measuring filter.

9. The method according to claim 8, wherein said determining an average slope value using said slope value and said one or more additional slope values comprises weighting each additional slope value in proportion to a length of the additional portion associated with the additional slope value.

10. A pulse processor adapted to perform the method according to claim 1.

11. An energy-dispersive radiation spectrometry system, comprising:
a detector for converting an incoming photon into an output comprising a current pulse;
a preamplifier for converting the output of said detector into a preamplifier signal comprising a voltage signal, said preamplifier signal having a plurality of step edges each corresponding to a respective photon; and
a pulse processor having an energy measuring filter, said pulse processor being adapted to adjusting a response of said energy measuring filter by:
receiving a digital version of said preamplifier signal comprising a plurality of successive digital samples each having a digital value, said preamplifier signal having a portion defined by a first one of said step edges and a second one of said step edges immediately following said first one of said step edges;
determining a first integral of the digital values of the digital samples associated with a first half of said portion;
determining a second integral of the digital values of the digital samples associated with a second half of said portion following said first half;
determining an integral difference equal to a difference between said second integral and said first integral;
determining a slope value by normalizing said integral difference by a length of said portion; and
using said slope value to correct the response of said energy measuring filter.

12. The energy-dispersive radiation spectrometry system according to claim 11, wherein said portion has n ones of said digital samples associated therewith, wherein the digital values of the digital samples associated with a first half of said portion are a first group of said n ones of said digital samples, said first group being a first successive n/2 ones of said n ones of said digital samples, wherein the digital values of the digital samples associated with a second half of said portion are a second group of said n ones of said digital samples, said second group being a second successive n/2 ones of said n ones of said digital samples following said first group, wherein said first integral is an integral of the digital values of the digital samples of said first group, wherein said second integral is an integral of the digital values of the digital samples of said second group, and wherein said determining a slope value comprises determining an intermediate slope value by dividing said integral difference by n/2 and determining said slope value by dividing said intermediate slope value by n/2.

13. The energy-dispersive radiation spectrometry system according to claim 12, wherein said first integral is a sum of the digital values of the digital samples of said first group, and wherein said second integral is a sum of the digital values of the digital samples of said second group.

14. The energy-dispersive radiation spectrometry system according to claim 11, wherein said slope value is a slope over one unit time.

15. The energy-dispersive radiation spectrometry system according to claim 14, wherein said using comprising multiplying said slope value by a half-width of said energy measuring filter to get a slope correction value and using said slope correction value to correct the response of said energy measuring filter.

16. The energy-dispersive radiation spectrometry system according to claim 11, wherein said energy measuring filter is an FIR filter.

17. The energy-dispersive radiation spectrometry system according to claim 11, wherein said length of said portion comprises a number of said digital samples that are associated with said portion.

18. The energy-dispersive radiation spectrometry system according to claim 11, wherein said preamplifier signal has one or more additional portions, each additional portion being defined by a respective first additional one of said step edges and a respective second additional one of said step edges immediately following said first additional one of said step edges, said pulse processor being further adapted to adjust a response of said energy measuring filter by determining one or more additional slope values by, for each said additional portion: (i) determining a first integral of the digital values of the digital samples associated with a first half of the additional portion; (ii) determining a second integral of the digital values of the digital samples associated with a second half of the additional portion following said first half of said additional portion; (iii) determining an integral difference associated with the additional portion equal to a difference between the second integral associated with the additional portion and the first integral associated with the additional portion; and (iv) determining an additional slope value for the additional portion by normalizing said integral difference associated with the additional portion by a length of the additional portion, and wherein said using said slope value to correct the response of said energy measuring filter comprises determining an average slope value using said slope value and said one or more additional slope values and using said average slope value to correct the response of said energy measuring filter.

19. The energy-dispersive radiation spectrometry system according to claim 18, wherein said determining an average slope value using said slope value and said one or more additional slope values comprises weighting each additional slope value in proportion to a length of the additional portion associated with the additional slope value.

* * * * *

UNITED STATES PATENT AND TRADEMARK OFFICE
CERTIFICATE OF CORRECTION

PATENT NO.         : 8,039,787 B2
APPLICATION NO.    : 12/184500
DATED              : October 18, 2011
INVENTOR(S)        : Richard B. Mott It is certified that error appears in the above-identified patent and that said Letters Patent is hereby corrected as shown below:

Figure 6, sheet 6 of 7 first column, line 18, "BITTOM LINE)" should read --BOTTOM LINE)--.
Column 2, line 27, "In such as case" should read --In such a case--.
Column 4, line 40, "may a slope" should read --may be a slope--.
Column 8, line 4, "less noisy" should read --less noise--.
Column 10, line 8, "could be use" should read --could be used--.
Column 10, line 17, "average of" should read --average of the--.
Column 10, line 47, "may already by" should read --may already be--.
Column 13, line 7, "that 1.5 W" should read --than 1.5 W--.
Column 14, line 62, "comprising" should read --comprises--.
Column 16, line 24, "comprising" should read --comprises--.

Signed and Sealed this
Third Day of January, 2012

David J. Kappos
*Director of the United States Patent and Trademark Office*